United States Patent [19]
Mote, Jr.

[11] Patent Number: 5,654,929
[45] Date of Patent: Aug. 5, 1997

[54] REFRESH STRATEGY FOR DRAMS

[75] Inventor: L. Randall Mote, Jr., Laguna Hills, Calif.

[73] Assignee: Samsung Electronics Co., Ltd., Seoul, Rep. of Korea

[21] Appl. No.: 527,950

[22] Filed: May 14, 1995

[51] Int. Cl.$^6$ ..................................................... G11C 7/00
[52] U.S. Cl. ..................... 365/222; 365/149; 365/193; 365/227; 365/228; 365/230.03
[58] Field of Search ............................ 365/222, 230.03, 365/230.04, 227, 228, 149, 193

[56] References Cited

U.S. PATENT DOCUMENTS 5,475,645  12/1995  Wada ....................................... 365/222
5,500,831  3/1996  Chen et al. ........................... 365/222 X

*Primary Examiner*—Do Hyun Yoo
*Attorney, Agent, or Firm*—Knobbe, Martens, Olson & Bear, LLP

[57] ABSTRACT

An improved method of accessing dynamic random access memory (DRAM) banks during refresh cycles contemplates sequentially accessing DRAM banks which do not share common filtering capacitors. In this manner, voltage drops caused by refresh accesses are not observed in consecutive clock cycles at the same filtering capacitors so that the filtering capacitors will have sufficient recovery time to restore the supply voltage to the original voltage level before another refresh hit occurs at the same capacitor. In this manner, significant voltage drops are alleviated at the voltage supply inputs to the DRAM banks.

7 Claims, 3 Drawing Sheets

REFRESH STRATEGY FOR DRAMS

BACKGROUND OF THE INVENTION

1. Field of the Invention

The present invention relates to a method of refreshing memory cells within a dynamic random access memory (DRAM), and in particular, to a method which reduces the refresh noise on the drain voltage of a DRAM using CMOS.

2. Description of the Related Art

As is well known in the art, dynamic random access memories require periodic refreshing of the memory cells within the DRAM so that the data stored within each memory cell does not corrupt or decay over time. By periodically refreshing each row of memory within a DRAM, energy is supplied to each of the capacitive memory cells within the row so that the data stored in the memory cells does not decay. Thus, refreshing is an essential element of memory storage for volatile memories.

A refresh may be a CAS (column address select) before RAS (row address select) refresh, or a RAS-only refresh. A CAS before RAS refresh involves asserting the CAS signal before the RAS signal is asserted to indicate that the next cycle is a refresh cycle. In response to the assertion of a CAS before a RAS, an internal address counter in the memory supplies the row address of the next row to be refreshed. A RAS-only refresh operates in a similar manner to refresh selected rows of memory; however, the address of the row to be refreshed is instead supplied by an external refresh circuit.

Whenever a refresh is performed, however, a current surge in the refreshed DRAM results in a drop of the line voltage supplying the DRAM. The noise caused by the drop in line voltage can affect the operation of that DRAM or other DRAMs supplied by the same voltage. This is particularly true in DRAMs which employ CMOS technology, since the internal circuitry of such DRAMS is particularly susceptible to sudden voltage drops or noise.

Thus, in order to prevent large noise spikes during a refresh cycle, previous refresh methods have contemplated staggering refreshes applied to adjacent single in-line memory modules (SIMMs) so that the refreshes occur one after the other and are separated by at least one clock cycle. Furthermore, in order to reduce the amount of voltage drop caused by refresh accesses, filtering capacitors are provided for each memory bank to hold the line voltage up during a high current draw. Although this approach serves to distribute the voltage drop produced during a refresh evenly over multiple clock cycles, voltage drop reduction is still not optimized. This is because sometimes adjacent memory banks share one or more filtering capacitors so that if, for example, the first and second memory banks are refreshed in sequence, the filtering capacitors do not have sufficient recovery time to recharge to the nominal line voltage. Thus, if memory banks sharing the same filtering capacitor are refreshed in consecutive clock cycles, there is a possibility that a significant voltage drop will be observed on the voltage supply line connected to the accessed memory banks and that the resulting noise will affect the operation of the DRAMs.

SUMMARY OF THE INVENTION

A method for refreshing volatile memory banks which share a common filtering capacitor used to filter out voltage drops on a voltage supply line comprises the steps of: initiating a refresh of a first memory bank which shares the filtering capacitor in common with a second memory bank; initiating a refresh of a third memory bank which does not share the capacitor with the first and second memory banks after initiating the refresh of the first memory bank; and refreshing the second memory bank after initiating the refresh of the third memory bank.

According to a preferred embodiment, the first, second and third memory banks are CMOS memory banks.

According to another preferred embodiment, the method includes the step of initiating a refresh of a fourth memory bank subsequent to initiating the refresh of the second memory bank, wherein the fourth memory bank and the third memory bank share another filtering capacitance.

Under another aspect, the present invention is a method of reducing supply voltage drops which occur during refreshes to memory banks sharing a common capacitor, wherein a supply voltage drop is observed at the memory banks each time a refresh occurs. The time between refresh cycles is such that immediately successive refreshes to the first and second memory banks would result in a larger supply voltage drop at the first and second memory banks than would a single refresh to either one or the other of the first and second memory banks. The method comprises the steps of: initiating a refresh to a first memory bank which shares the capacitor in common with a second memory bank; and initiating a refresh to the second memory bank after a sufficient number of refresh cycles so that the refresh to the second memory bank does not result in a larger supply voltage drop at the first and second memory banks than would a solitary refresh to either one or the other of the first and second memory banks.

DETAILED DESCRIPTION OF THE PREFERRED EMBODIMENT

Figure 1:
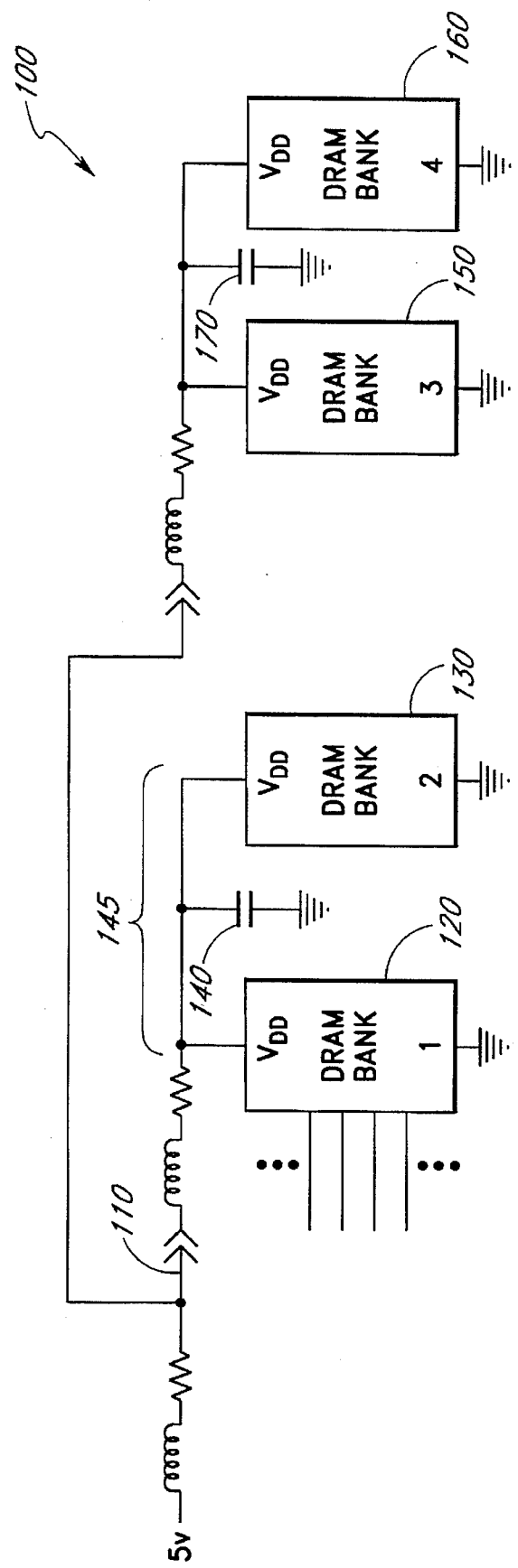
FIG. 1 is schematic block diagram which illustrates two pair of memory banks which each share a filtering capacitor.

FIG. 1 is a simplified schematic block diagram which illustrates a plurality of dynamic random accessory memory (DRAM) banks 100 in connection with a voltage supply line 110. As shown in FIG. 1, a first DRAM bank 120 and a second DRAM bank 130 share a filtering capacitor bank 140. Such an implementation is common in applications where, for example, a dual in-line memory module (DIMM) is constructed to have DRAMs on both sides of a circuit board. As will be appreciated by those of ordinary skill in the art, the capacitor bank 140 may comprise a plurality of capacitors shared by each of the DRAM elements within the DRAM banks 120, 130. Similarly, as further illustrated in FIG. 1, a third DRAM bank 150 and a fourth DRAM bank 160 share a capacitor bank 170.

In operation, refreshes of the memory cells within each of the DRAM banks 120, 130, 150 and 160, are performed in a predetermined order so as to reduce the instantaneous current drain via the line 110. As is well known by those of skill in the art, the voltage supply line 110 includes some impedance so that when a sudden current draw occurs at some point along the line 110, it is possible that a significant voltage drop will be observed at that location of the line 110. For this reason, the filtering capacitors 140, 170 are included at a number of locations along the voltage source line 110 to alleviate the effects of such a voltage draw. In addition, the refresh accesses which are often responsible for sudden current draws on the line 110 are staggered to reduce the total current draw at any given place along the line 110.

Figure 2:
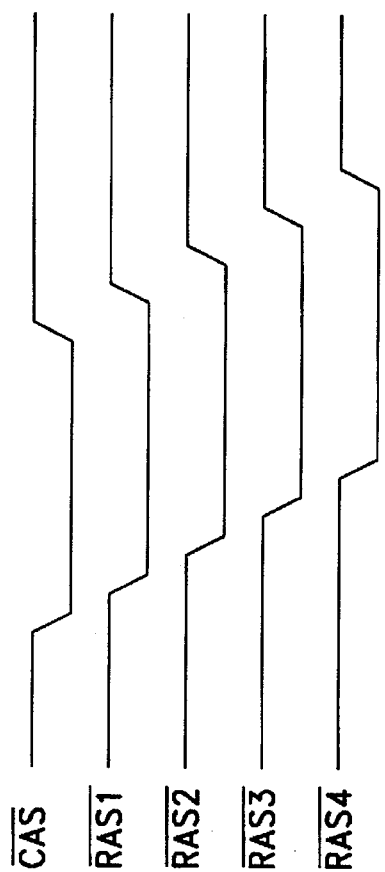
FIG. 2 is a timing diagram which illustrates the order of refresh accesses to each of the memory banks as performed in accordance with the method of the prior art.
Figure 4A:
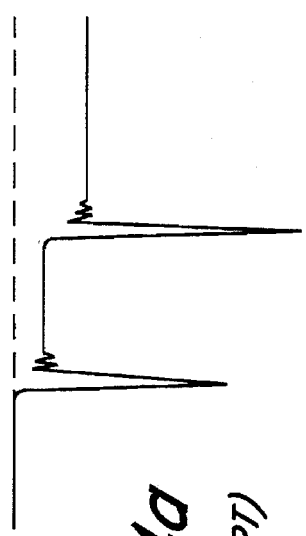
FIGS. 4A through 4C are signal diagrams which illustrate the voltage drop which occurs during a refresh for the case where (A) a staggered method of the prior art is used to access adjacent memory banks where no filtering capacitor is used; (B) the method of the prior art is used to refresh adjacent memory banks sharing the same filtering capacitors; and (C) the method of the present invention is used to access adjacent memory banks at spaced intervals where the filtering capacitor is shared between the memory banks.
Figure 4B:
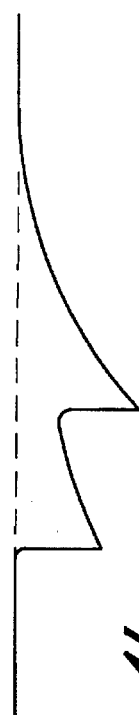

Certain previous methods of reducing the current draw at any given place along the line 110 have included staggering refreshes to each of the DRAM banks so that the row address strobe line is not asserted at the same time for any of the DRAM banks 120, 130, 150, 160. As shown in FIG. 2, in order to initiate the refresh operation, the column address strobe line is asserted followed by the assertion of each of the row address strobe lines (i.e., corresponding to each of the access DRAM banks 120, 130, 150, 160, respectively) in succession. However, when the row address strobe signals are asserted in quick succession for DRAM banks sharing the same filtering capacitors, it is possible that the filtering capacitors will not have sufficient time to recover from the current draw which follows the first row address strobe assertion so that the additional current draw which follows the assertion of the second row address strobe signal results in a voltage drop along the line 110 from a voltage level which is already below the normal voltage level. This case is illustrated in FIGS. 4A and 4B. Specifically, FIG. 4A shows the voltage drop which would be observed along the line 110 at the DRAM banks 120, 130 if the RAS 2 signal is asserted immediately after the RAS 1 signal (as shown in FIG. 2), while no filtering capacitor 140 is present. Thus, FIG. 4A illustrates the close proximity of the voltage drops observed at the voltage inputs to the memory banks 120, 130 when these adjacent memory banks are refreshed in consecutive clock cycles.

Because the filtering capacitor 140 is present on the line 110 adjacent to the DRAM banks 120, 130, the voltage drop observed is represented as shown in FIG. 4B. Although the voltage drop observed at the voltage supply inputs to the DRAM banks 120, 130 is not as severe as the voltage drop which would be observed if the capacitor 140 were not present at the first voltage drop, when the second voltage drop occurs while the voltage on the line 110 near the DRAM banks 120, 130 has not yet recovered to its original value, a large drop is observed upon the assertion of the second row address strobe signal. Thus, it is apparent that in some cases, the method of the prior art results in a significant voltage drop to the voltage supply inputs of adjacent DRAM banks if the refreshes occur in rapid succession so that the filtering capacitor 140 does not have time to recover from the original voltage drop. This problem is further exacerbated if the DRAM banks 120, 130 employ CMOS technology, because CMOS technology is particularly susceptible to noise in the presence of such voltage drops.

Figure 3:
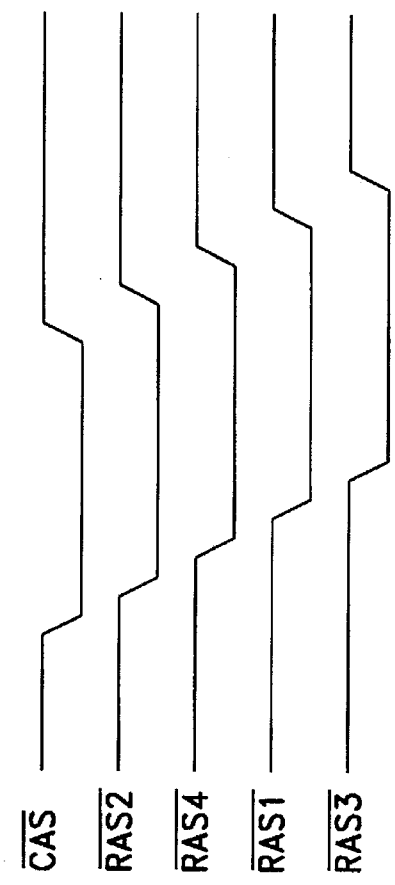
FIG. 3 is a timing diagram which illustrates the order of refresh accesses to the memory banks of FIG. 1 in accordance with the method of the present invention.

In accordance with the teachings of the present invention, however, an improved method of accessing DRAM banks during refreshes is illustrated in FIG. 3. As shown in FIG. 3, the sequence of DRAM refreshes is altered so that DRAM banks sharing the same filtering capacitors are not accessed in consecutive clock cycles. That is, as shown in FIG. 3, the row address strobe used to refresh the second DRAM bank 130 is asserted, followed by the row address strobe signal used to refresh the fourth DRAM bank 160, followed by the row address strobe signal used to refresh the first DRAM bank 120, and, finally, the row address strobe signal used to refresh the third DRAM bank 150 is asserted. Thus, it can be seen from FIG. 3 that refreshes for memory banks sharing the same filtering capacitor are never initiated in consecutive clock cycles.

Figure 4C:

The benefits of this improved refresh sequence are shown in FIG. 4C. As shown in FIG. 4C, the voltage drops are spaced apart by a sufficient width so that the capacitor 140 has sufficient time to recover to the original 5-volt level before the next voltage drop is observed at the capacitor 140. In this manner, only shallow voltage drops occur at the voltage supply inputs of the DRAM banks 120, 130. The same effects are observed at the DRAM banks 150, 160, as well. Thus, the improved refresh sequence method of the present invention ensures that a significant voltage drop is not observed by any of the DRAM banks 120, 130, 150 and 160.

Although the preferred embodiment of the present invention has been described in detail above, it will be understood by those of skill in the art that certain obvious modifications could be made to the present invention without departing from its spirit or central characteristics. For example, the invention could be used in a system where RAS-only refreshes are performed instead of CAS before RAS refreshes. Thus, the above description should be construed as illustrative and not restrictive. Therefore, the scope of the present invention should be interpreted in light of the following appended claims.

What is claimed is:

1. A method for refreshing volatile memory banks which share at least one common filtering capacitor used to filter out voltage drops on a voltage supply line, said method comprising the steps of:

initiating a refresh of a first memory bank which shares said at least one filtering capacitor in common with a second memory bank;

initiating a refresh of a third memory bank which does not share said at least one filtering capacitor with said first and second memory banks after initiating said refresh of said first memory bank; and refreshing said second memory bank after initiating said refresh of said third memory bank.

2. A method as defined in claim 1, wherein said first, second and third memory banks are CMOS memory banks.

3. A method as defined in claim 1, further comprising the step of initiating a refresh of a fourth memory bank subsequent to initiating said refresh of said second memory bank, wherein said fourth memory bank and said third memory bank share another filtering capacitance.

4. A method as defined in claim 1, wherein each said refresh is a CAS before RAS refresh.

5. A method of reducing supply voltage drops which occur during refreshes to a first memory bank and a second memory bank, said first and second memory banks sharing at least one common capacitor, wherein a supply voltage drop is observed at said first and second memory banks each time a refresh occurs to either said first memory bank or said second memory bank, and wherein the time between refresh cycles is such that immediately successive refreshes to said first and second memory banks would result in a larger supply voltage drop at said first and second memory banks than would a single refresh to either one or the other of said first and second memory banks, said method comprising the steps of:

initiating a refresh to said first memory bank which shares said at least one capacitor in common with said second memory bank; and initiating a refresh to said second memory bank after a sufficient number of refresh cycles have been initiated on at least one other memory bank which does not share said at least one capacitor with said first and second memory banks, so that said refresh to said second memory bank does not result in a larger supply voltage drop at said first and second memory banks than would a solitary refresh to either one or the other of said first and second memory banks.

6. A method as defined in claim 5, wherein said sufficient number of refresh cycles is one refresh cycle.

7. A method as defined in claim 5, wherein each said refresher is a CAS before RAS refresh.

* * * * *

UNITED STATES PATENT AND TRADEMARK OFFICE
CERTIFICATE OF CORRECTION

PATENT NO.   : 5,654,929
DATED        : August 5, 1997
INVENTOR(S)  : L. Randall Mote, Jr.

It is certified that error appears in the above-indentified patent and that said Letters Patent is hereby corrected as shown below:

Title page, item [22], change the filing date from "May 14, 1995" to -- September 14, 1995--.

Signed and Sealed this

Twenty-first Day of October 1997

Attest:

BRUCE LEHMAN

Attesting Officer

Commissioner of Patents and Trademarks